(12) United States Patent
Amikawa et al.

(10) Patent No.: US 9,419,052 B2
(45) Date of Patent: Aug. 16, 2016

(54) SOLID-STATE IMAGING APPARATUS, METHOD FOR DRIVING THE SAME, AND IMAGING APPARATUS

(71) Applicant: PANASONIC INTELLECTUAL PROPERTY MANAGEMENT CO., LTD., Osaka (JP)

(72) Inventors: Hiroyuki Amikawa, Kyoto (JP); Masashi Murakami, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 114 days.

(21) Appl. No.: 14/554,038

(22) Filed: Nov. 26, 2014

(65) Prior Publication Data

US 2015/0076327 A1 Mar. 19, 2015

Related U.S. Application Data

(63) Continuation of application No. PCT/JP2013/003140, filed on May 17, 2013.

(30) Foreign Application Priority Data

May 30, 2012 (JP) ................................ 2012-122606

(51) Int. Cl.
*H01L 27/00* (2006.01)
*H04N 3/14* (2006.01)
(Continued)

(52) U.S. Cl.
CPC .... *H01L 27/14831* (2013.01); *H01L 27/14612* (2013.01); *H04N 5/355* (2013.01); *H04N 5/3698* (2013.01); *H04N 5/3741* (2013.01)

(58) Field of Classification Search
CPC .................................................... H04N 5/3698
USPC ........................................ 250/208.1; 348/308
See application file for complete search history.

(56) References Cited

U.S. PATENT DOCUMENTS

| 7,242,043 B2 | 7/2007 | Ohkawa |
| 7,394,492 B2 | 7/2008 | Shinohara |

(Continued)

FOREIGN PATENT DOCUMENTS

| JP | 2005-101442 A | 4/2005 |
| JP | 2005-192191 A | 7/2005 |

(Continued)

OTHER PUBLICATIONS

International Search Report issued in International Application No. PCT/JP2013/003140 with Date of mailing Jun. 25, 2013, with English Translation.

*Primary Examiner* — Thanh Luu
(74) *Attorney, Agent, or Firm* — McDermott Will & Emery LLP

(57) ABSTRACT

A solid-state imaging apparatus includes a plurality of pixel cells arranged in a pixel array unit, a vertical signal line and a pixel power supply line each connected to a source electrode and a drain electrode of an amplifying transistor, a Pch transistor for supplying potential AVDD to the vertical signal line, a Pch transistor for supplying potential PBIAS_H higher than the potential AVDD to the vertical signal line, a Pch transistor for supplying the potential PBIAS_H to the pixel power supply line, wherein while the transfer transistor is turned ON and transfers signal charges photoelectrically converted by a photodiode to the floating diffusion portion, the Pch transistors are turned ON and the potential PBIAS_H is applied to the vertical signal line and the pixel power supply line.

9 Claims, 6 Drawing Sheets

(51) Int. Cl.
*H01L 27/148* (2006.01)
*H04N 5/355* (2011.01)
*H04N 5/369* (2011.01)
*H04N 5/374* (2011.01)
*H01L 27/146* (2006.01)

(56) References Cited

U.S. PATENT DOCUMENTS

| | | | |
|---|---|---|---|
| 7,924,331 B2 | 4/2011 | Nezaki et al. | |
| 7,952,627 B2 | 5/2011 | Morimoto et al. | |
| 8,085,326 B2 | 12/2011 | Tanaka | |
| 8,212,904 B2 | 7/2012 | Ishimoto et al. | |
| 8,446,504 B2 | 5/2013 | Taruki et al. | |
| 2003/0214596 A1* | 11/2003 | Simony | H04N 5/363 348/308 |
| 2005/0067640 A1 | 3/2005 | Ohkawa | |
| 2005/0121519 A1 | 6/2005 | Shinohara | |
| 2007/0103574 A1 | 5/2007 | Tanaka | |
| 2007/0146516 A1 | 6/2007 | Nezaki et al. | |
| 2007/0252184 A1 | 11/2007 | Ohkawa | |
| 2008/0303929 A1 | 12/2008 | Morimoto et al. | |
| 2009/0322921 A1 | 12/2009 | Ishimoto et al. | |
| 2011/0234871 A1 | 9/2011 | Taruki et al. | |

FOREIGN PATENT DOCUMENTS

| | | |
|---|---|---|
| JP | 2007-123604 A | 5/2007 |
| JP | 2007-166320 A | 6/2007 |
| JP | 2008-301378 A | 12/2008 |
| JP | 4194544 B2 | 12/2008 |
| JP | 2010-011224 A | 1/2010 |
| JP | 4453306 B2 | 4/2010 |
| JP | 2010-273095 A | 12/2010 |
| JP | 2011-205249 A | 10/2011 |

* cited by examiner

SOLID-STATE IMAGING APPARATUS, METHOD FOR DRIVING THE SAME, AND IMAGING APPARATUS

CROSS REFERENCE TO RELATED APPLICATIONS

This is a continuation application of PCT International Application No. PCT/JP2013/003140 filed on May 17, 2013, designating the United States of America, which is based on and claims priority of Japanese Patent Application No. 2012-122606 filed on May 30, 2012. The entire disclosures of the above-identified applications, including the specifications, drawings and claims are incorporated herein by reference in their entirety.

FIELD

The present disclosure relates to a solid-state imaging apparatus, a method for driving the solid-state imaging apparatus, and an imaging apparatus that uses the solid-state imaging apparatus as an imaging device.

BACKGROUND

In recent years, digital cameras incorporating solid-state imaging apparatuses have been widely available. FIG. 5 is a diagram illustrating a configuration of a pixel of a solid-state imaging apparatus according to a conventional technique disclosed in Patent Literature (PTL) 1. As illustrated in FIG. 5, a pixel 1 includes a photodiode 2, an amplifying transistor 3, a transfer transistor 5, a reset transistor 6, a selection transistor 7, and a capacitor 17. Moreover a floating diffusion portion (FD portion) 4 is provided in the pixel 1.

A transistor 15 has a gate connected to a control line 16, and has a drain and a source connected to a signal output line 12 and a power supply, respectively. The control line 16 is a control line for controlling a potential of the signal output line 12 by applying a signal (pulse) to a gate of the transistor 15.

Next, an operation of the pixel illustrated in FIG. 5 will be described.

FIG. 6 is a timing chart for explaining the operation of the pixel illustrated in FIG. 5

In FIG. 6, signals SC, RC, TC, and VC are drive pulse signals to be applied via control lines 10, 9, 8, and 16 to transistors 7, 6, 5, 15, respectively, and potentials FD and SO indicate potentials of the FD portion 4 and the signal output line 12, respectively. It should be noted that each of the transistors 7, 6, and 5 in FIG. 5 is an N-channel type MOS transistor. When a gate potential is at a high level ("H"), the transistor becomes an ON state. When a gate potential is at a low level ("L"), the transistor becomes an OFF state. Moreover, the transistor 15 is a P-channel type MOS transistor. When a gate potential is at "H", the transistor 15 becomes an OFF state. When a gate potential is at "L", the transistor 15 becomes an ON state.

According to a configuration of the solid-state imaging apparatus according to the conventional technique, at a time when signal charges are transferred from the photodiode 2 to the FD portion 4, that is, during a period in which the signal TC to be supplied to the gate of the transfer transistor 5 via the control line 8 becomes "H" (time T15 to time T16), by putting the transistor 15 in an ON state, the potential SO of the signal output line 12 which supplies an output potential corresponding to the reset potential is set to a power supply potential, and the potential FD of the FD portion 4 capacitively coupled with the signal output line 12 by a potential fluctuation of this signal output line 12 is increased by $\Delta V1$.

With this, since a condition for outputting a saturation voltage Vsat is $(Vrs-Vsat+\Delta V1)>Vd$, a value of Vd that determines the limit of the saturation voltage can be set larger than before, and it is possible to obtain a larger saturation voltage. Therefore, it is possible to provide a method for driving a complementary metal-oxide-semiconductor (CMOS) type solid-state imaging apparatus that realizes a high dynamic range, and a dynamic range can be higher than that of the conventional CMOS type solid-sate imaging apparatus.

CITATION LIST

Patent Literature

[PTL 1] Japanese Patent No. 4194544

Summary

Technical Problem

Progress is made in reducing a power supply voltage for reducing power consumption of a solid-state imaging apparatus.

However, there is a problem that when a power supply voltage is excessively reduced in the solid-state imaging apparatus according to the conventional technique, it is difficult to stably obtain a high dynamic range.

One non-limiting and exemplary embodiment provides a solid-state imaging apparatus that realizes both a reduction in power supply voltage and a high dynamic range.

Solution to Problem

An aspect of a disclosed solid-state imaging apparatus is a solid-state imaging apparatus comprising: a pixel array unit in which a plurality of pixel cells are arranged in a matrix, each of the plurality of pixel cells including a photoelectric conversion element, a transfer transistor that transfers signal charges photoelectrically converted by the photoelectric conversion element to a floating diffusion, a reset transistor that resets the floating diffusion, and an amplifying transistor that outputs an amplified signal corresponding to an amount of the signal charges; a vertical signal line that is connected to a source electrode of the amplifying transistor and receives an output of the amplifying transistor; a pixel power supply line that is connected to a drain electrode of the amplifying transistor; a first control transistor for supplying a first potential to the vertical signal line; a second control transistor for supplying a second potential higher than the first potential to the vertical signal line; and a third control transistor for supplying the second potential to the pixel power supply line, wherein, during a period in which the transfer transistor is turned ON and transfers the signal charges to the floating diffusion, the second control transistor and the third control transistor are turned ON and the second potential is applied to the vertical signal line and the pixel power supply line.

It should be noted that these general and specific aspects may be implemented using a system, a method, and an integrated circuit, and any combination of systems, methods, and integrated circuits.

Advantageous Effects

By setting a signal line and a pixel power supply to a potential higher than a power supply potential during the transfer of signal charges, the present aspect makes it possible to increase the potential of the FD portion and realize both a reduction in power supply voltage and an increase in saturation charge, due to involvement by a gate capacitance of an amplifying transistor between an output signal line and an FD portion, a gate capacitance of an amplifying transistor between a pixel power supply and an FD portion, an overlap capacitance, and a parasitic capacitance of the wiring.

Moreover, since a high potential difference is not caused between a drain and a source of the amplifying transistor, there is no degradation in reliability of the transistor.

With these, it is possible to realize both a reduction in power consumption and a high dynamic range while ensuring the reliability of the transistor.

BRIEF DESCRIPTION OF DRAWINGS

These and other objects, advantages and features of an embodiment of the present disclosure will become apparent from the following description thereof taken in conjunction with the accompanying drawings that illustrate a specific embodiment of the present disclosure.

Figure 1:
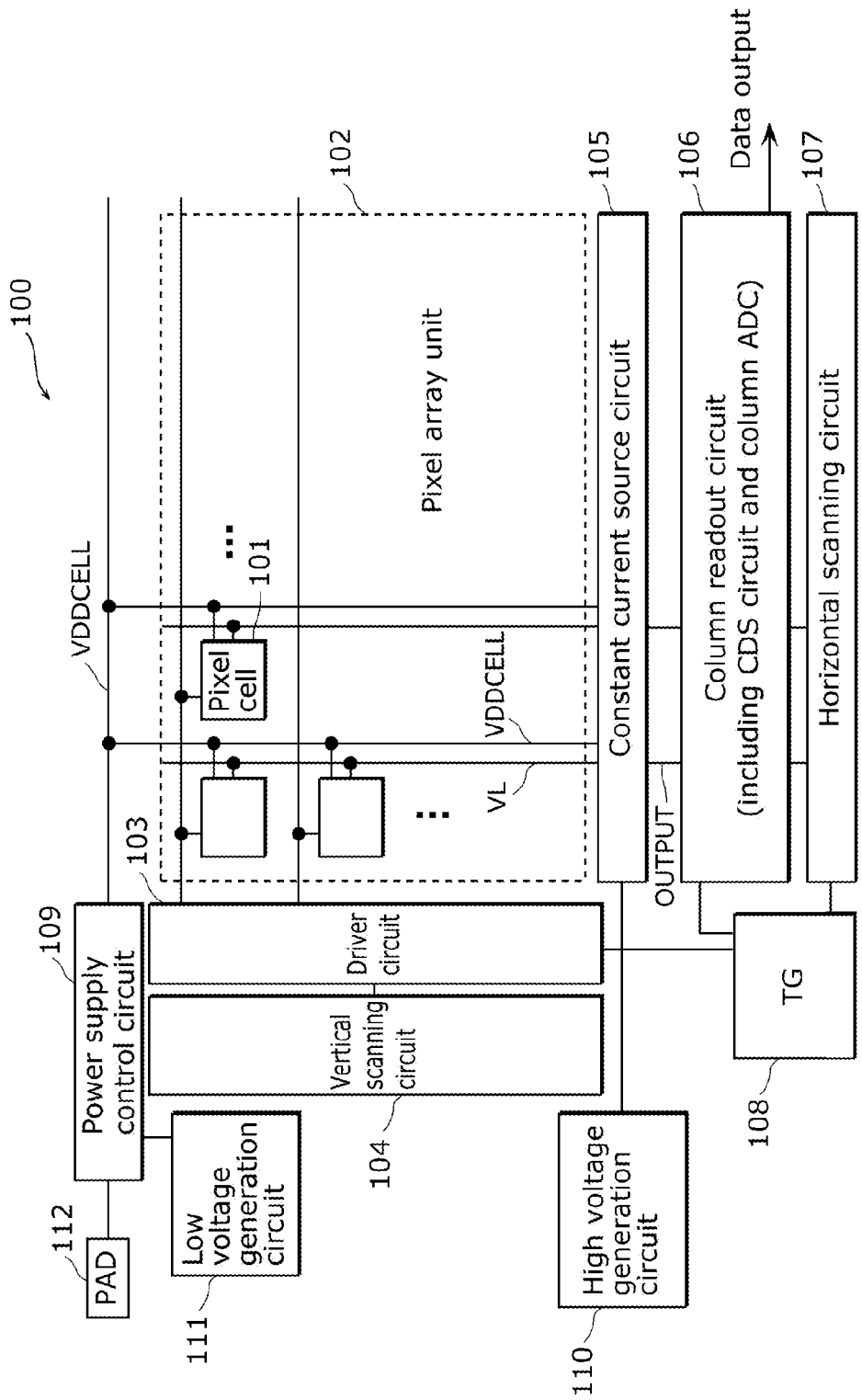
FIG. 1 is a block diagram illustrating an outline of a configuration of an image sensor.

DESCRIPTION OF EMBODIMENTS (Underlying Knowledge Forming Basis of the Present Disclosure)

In relation to the solid-state imaging apparatus disclosed in the Background section, the inventors have found the following problem.

When a power supply voltage is excessively reduced in the solid-state imaging apparatus according to the conventional technique, the potential of the FD portion 4 during a reset operation is decreased in accordance with the decrease in the power supply voltage, making it difficult to read a signal from the photodiode 2. Moreover, even when the signal output line 12 is changed to the power supply voltage during the aforementioned transfer of signal charges and the potential of the FD portion 4 is changed through coupling of a parasitic capacitance, the potential of the FD portion 4 is not sufficiently increased, leading to a transfer trouble of signal charges from the photodiode 2 to the FD portion 4.

Moreover, the potential at the drain side of the amplifying transistor 3 is changed to a potential higher than the power supply voltage. However, since the amplifying transistor 3 is ON during the transfer of signal charges, a current flows and a voltage drop occurs and therefore a desired high potential cannot be applied to the drain side. In addition, since a circuit to be supplied with high potential needs a large driving force, power consumption is increased.

Furthermore, a large potential difference is generated between a source and a drain of the amplifying transistor 3 by applying, during the transfer of signal charges, a potential higher than the power supply voltage to the drain of the amplifying transistor 3. Therefore, there is a concern about degradation in the reliability of the amplifying transistor 3 due to hot carriers.

In order to solve the aforementioned problem, an aspect of a disclosed solid-state imaging apparatus is a solid-state imaging apparatus comprising: a pixel array unit in which a plurality of pixel cells are arranged in a matrix, each of the plurality of the pixel cells including a photoelectric conversion element, a transfer transistor that transfers signal charges photoelectrically converted by the photoelectric conversion element to a floating diffusion, a reset transistor that resets the floating diffusion, and an amplifying transistor that outputs an amplified signal corresponding to an amount of the signal charges; a vertical signal line that is connected to a source electrode of the amplifying transistor and receives an output of the amplifying transistor; a pixel power supply line that is connected to a drain electrode of the amplifying transistor; a first control transistor for supplying a first potential to the vertical signal line; a second control transistor for supplying a second potential higher than the first potential to the vertical signal line; and a third control transistor for supplying the second potential to the pixel power supply line, wherein, during a period in which the transfer transistor is turned ON and transfers the signal charges to the floating diffusion, the second control transistor and the third control transistor are turned ON and the second potential is applied to the vertical signal line and the pixel power supply line.

Moreover, the solid-state imaging apparatus may further comprise a constant current source transistor that is provided on the vertical signal line and forms a source follower with the amplifying transistor; and a fourth control transistor that controls conduction and non-conduction between the vertical signal line and the constant current source transistor, wherein, during a period in which at least the second control transistor and the third control transistor are ON, the fourth control transistor is OFF.

In order to solve the aforementioned problem, an aspect of a disclosed solid-state imaging apparatus is a method for driving a solid-state imaging apparatus, the solid-state imaging apparatus including: a pixel array unit in which a plurality of pixel cells are arranged in a matrix, each of the plurality of the pixel cells including a photoelectric conversion element, a transfer transistor that transfers signal charges photoelectrically converted by the photoelectric conversion element to a floating diffusion, a reset transistor that resets the floating diffusion, and an amplifying transistor that outputs an amplified signal corresponding to an amount of the signal charges; a vertical signal line that is connected to a source electrode of the amplifying transistor and receives an output of the amplifying transistor; a pixel power supply line that is connected to a drain electrode of the amplifying transistor; a first control transistor for supplying a first potential to the vertical signal line; a second control transistor for supplying a second potential higher than the first potential to the vertical signal line; and a third control transistor for supplying the second potential to the pixel power supply line, the method comprising turning ON the second control transistor and the third control transistor and applying the second potential to the vertical signal line and the pixel power supply line, during a period in which the transfer transistor is turned ON and transfers the signal charges to the floating diffusion.

By setting a signal line and a pixel power supply to a potential higher than a power supply potential during the transfer of signal charges, the present aspect makes it possible to increase the potential of the FD portion and realize both a reduction in power source voltage and an increase in saturation charge, due to involvement by a gate capacitance of an amplifying transistor between the output signal line and the FD portion, a gate capacitance of an amplifying transistor between the pixel power supply and the FD portion, and an overlap capacitance and a parasitic capacitance of the wiring.

Moreover, since a high potential difference is not caused between a drain and a source of the amplifying transistor, there is no degradation in reliability of the transistor.

With these, it is possible to realize both a reduction in power consumption and a high dynamic range while ensuring the reliability of the transistor.

It should be noted that these general and specific aspects may be implemented using a system, a method, and an integrated circuit, and any combination of systems, methods, and integrated circuits.

Embodiment 1

The following describes a solid-state imaging apparatus according to Embodiment 1 and a method for driving the solid-state imaging apparatus with reference to the drawings.

It should be noted that each of the embodiments described below shows a specific example of the present disclosure. The numerical values, shapes, materials, structural elements, the arrangement and connection of the structural elements, steps, the processing order of the steps etc. shown in the following embodiments are mere examples, and therefore do not limit the scope of the appended Claims and their equivalents. Therefore, among the structural elements in the following exemplary embodiments, structural elements not recited in any one of the independent claims defining the most generic concept are described as arbitrary structural elements.

FIG. 1 is a block diagram illustrating a configuration of a solid-state imaging apparatus according to Embodiment 1.

As illustrated in FIG. 1, a solid-state imaging apparatus 100 according to the present embodiment includes: a pixel array unit 102 in which a plurality of pixel cells 101 comprising a photodiode performing photoelectric conversion and a transistor are arranged in a matrix; a driver circuit 103 that drives the pixel array unit 102; a vertical scanning circuit 104; and a vertical signal line VL that transmits the signal of the pixel cell (unit cell) 101 to each column circuit, wherein the vertical signal line VL is connected to a constant current source circuit 105 and a column readout circuit 106. The column readout circuit 106 includes a noise canceller circuit (CDS) that receives a pixel signal in one column and has a difference unit, and analog-to-digital conversion circuit (ADC) that receives a pixel signal from the CDS circuit. Then, data items each located in the column selected by a horizontal scanning circuit 107 and obtained by analog-to-digital conversion are sequentially outputted to the outside of the solid-state imaging apparatus. Moreover, the solid-state imaging apparatus 100 includes a timing generation circuit (TG) 108 that generates a pulse for operating each of the structural elements.

Moreover, the pixel cell 101 is connected to a pixel power supply line VDDCELL that supplies a power supply voltage, and the pixel power supply line VDDCELL is connected to a power supply control circuit 109 that controls the power supply. The power supply control circuit 109 is supplied with a voltage from a high voltage generation circuit 110 that generates a voltage higher than a power supply voltage AVDD, a low voltage generation circuit 111 that generates a voltage lower than the power supply voltage AVDD, and PAD 112.

The CDS circuit included in the column readout circuit 106 is connected to each column of the pixel cells 101 that are arranged in a matrix in the pixel array unit 102, for example.

Moreover, the CDS circuit performs signal process, through correlated double sampling (CDS) process, of removing reset noise generated in the pixel cell 101 and fixed pattern noise unique for a pixel that is caused by variations in threshold of the transistor, on a signal outputted via the vertical signal line VL from the pixel cell 101 in the row selected by the vertical scanning circuit 104, and temporarily stores the pixel signal after the signal process.

The analog-to-digital conversion circuit (ADC) has a function of automatic gain control (AGC) and a function of analog-to-digital conversion. A pixel signal that is an analog signal and is held in the CDS circuit by the ADC is converted into a digital signal.

Figure 2:
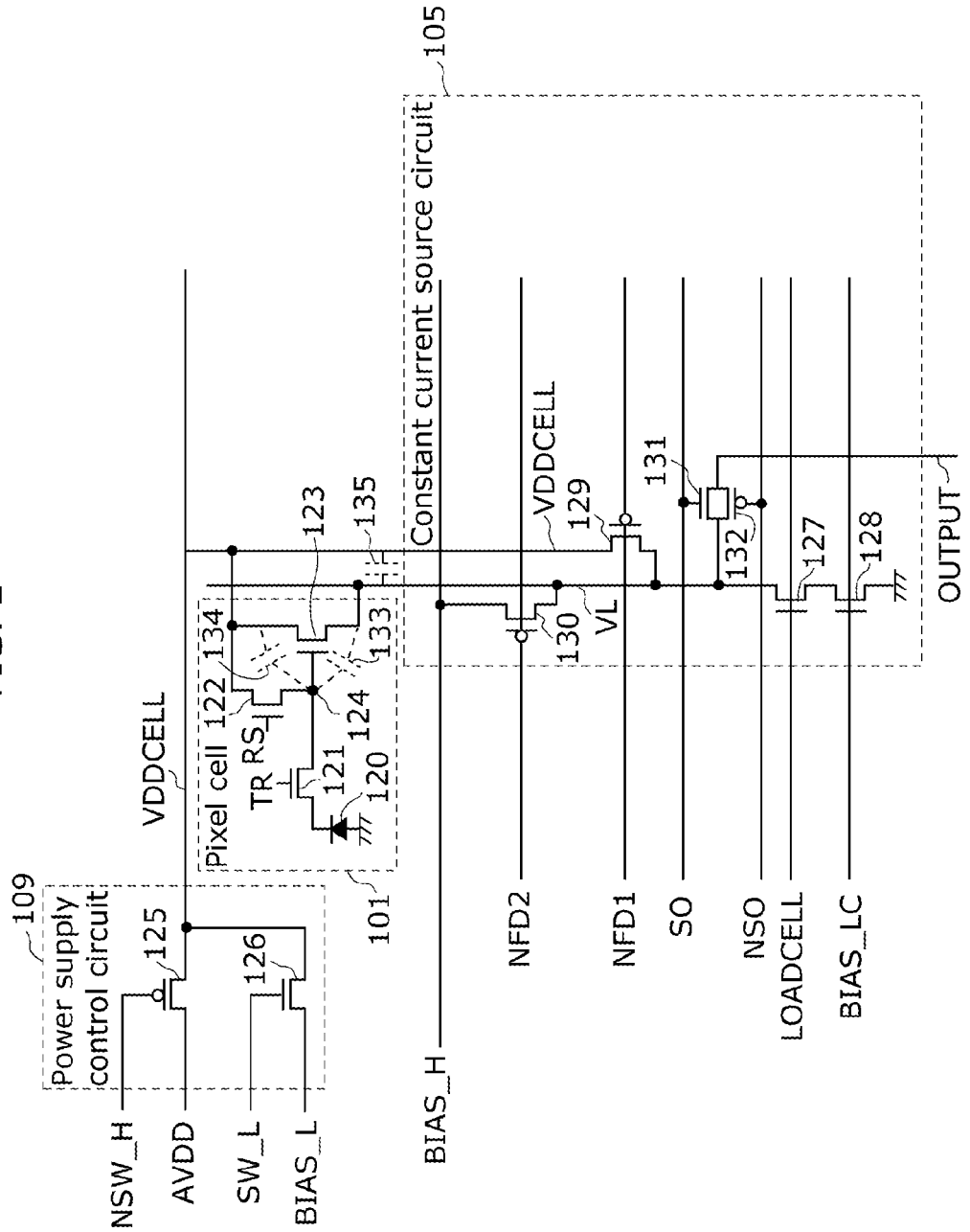
FIG. 2 is a diagram illustrating an example of a configuration of a pixel that constitutes a solid-state imaging apparatus according to Embodiment 1.

FIG. 2 is a diagram illustrating an example of a configuration of a pixel that constitutes the solid-state imaging apparatus according to Embodiment 1.

As illustrated in FIG. 2, the pixel cell 101 according to an example of this circuit includes, an element that performs photoelectric conversion, for example, a photodiode 120, a transfer transistor 121, a reset transistor 122, and an amplifying transistor 123. Each of the transistors 121 to 123 may be an N-channel MOS transistor. It should be noted that when a gate potential of the N-channel MOS transistor (Nch transistor) is at a "High" level, the N-channel MOS transistor becomes an ON state. When a gate potential of the N-channel MOS transistor is at a "Low" level, the N-channel MOS transistor becomes an OFF state. It should be noted that when a gate potential of the P-channel MOS transistor (Pch transistor) is at a "Low" level, the P-channel MOS transistor becomes an ON state. When a gate potential of the P-channel MOS transistor is at a "High" level, the P-channel MOS transistor becomes an OFF state.

The transfer transistor 121 is connected between a cathode electrode of the photodiode 120 and a floating diffusion (FD) portion 124. The transfer transistor 121 has a gate electrode connected to a transfer control line TR. When a "High" level is provided to the gate electrode of the transfer transistor 121 via the transfer control line TR at a transfer pulse φTR, the transfer transistor 121 becomes an ON state and the signal charges stored in the photodiode 120 after photoelectric conversion by the photodiode 120 (specifically, electrons) are transferred to the FD portion 124.

The reset transistor 122 has a gate electrode connected to a reset control line RS, a drain electrode connected to a pixel power supply line VDDCELL, and a source electrode connected to the FD portion 124. When a "High" level is provided, before the transfer of signal charges from the photodiode 120 to the FD portion 124, to the gate electrode of the reset transistor 122 via the reset control line RS at the reset pulse φRS, the reset transistor 122 becomes an ON state and a potential of the FD portion 124 is reset to the power supply voltage AVDD.

The amplifying transistor 123 has a gate electrode connected to the FD portion 124, a drain electrode connected to the pixel power supply line VDDCELL, and a source electrode connected to the vertical signal line VL. The amplifying transistor 123 outputs a potential of the FD portion 124 after being reset by the reset transistor 122 to the vertical signal line VL as a reset level, and further outputs a potential of the FD portion 124 after the transfer of signal charges by the transfer transistor 121 as a signal level to the vertical signal line VL.

The pixel power supply line VDDCELL is connected to the Pch transistor 125 that controls a supply of the power supply voltage AVDD. When a "Low" level is provided to the gate electrode of the Pch transistor 125 via a control line NSW_H at a control pulse φNSW_H, the Pch transistor 125 becomes an ON state and the power supply voltage AVDD is transmitted to each of the pixel cells 101.

Here, the Pch transistor 125 is an example of a first control transistor for supplying a first potential to the vertical signal line VL. The power supply voltage AVDD is an example of the first potential.

The Nch transistor 126 is connected between the pixel power supply line VDDCELL and a line BIAS_L that supplies a non-selection voltage of the pixel PBIAS_L. When a "High" level is provided to the gate electrode via a control line SW_L at the control pulse φSW_L, the Nch transistor 126 becomes an ON state and the non-selection voltage of the pixel PBIAS_L is transmitted to each of the pixel cells 101.

The Nch transistor 127 has a drain electrode connected to the vertical signal line VL, and a source electrode connected to a constant current source transistor 128 that generates a constant current. The constant current source transistor 128 has a gate electrode connected to a line BIAS_LC that supplies a current generation voltage for generating a constant current. When a "High" level is provided to the gate electrode of the Nch transistor 127 via a control line LOADCELL at a control pulse φLOADCELL, the Nch transistor 127 becomes an ON state and a constant current flows through the amplifying transistor 123, and a source follower is formed.

Here, the Nch transistor 127 is an example of a fourth control transistor that controls conduction and non-conduction between the vertical signal line VL and the constant current source transistor 128.

The Pch transistor 129 has a source electrode connected to the vertical signal line VL and a drain electrode connected to the pixel power supply line VDDCELL. When a "Low" level is provided to the gate electrode via the control line NFD1 at a control pulse φNFD1, the Pch transistor 129 is turned ON, and the vertical signal line VL and the pixel power supply line VDDCELL are short-circuited. With this, when the control pulse φNFD1 is provided while the power supply voltage AVDD is supplied to the pixel power supply line VDDCELL, the power supply voltage AVDD is supplied to the vertical signal line VL.

A Pch transistor 130 has a drain electrode connected to a line BIAS_H that supplies a voltage PBIAS_H higher than the power supply voltage AVDD, and a source electrode connected to the vertical signal line VL. When a "Low" level is provided to the gate electrode of the Pch transistor 130 via a control line NFD2 at a control pulse φNFD2, the Pch transistor 130 becomes an ON state and a voltage PBIAS_H higher than the power supply voltage AVDD is supplied to the vertical signal lines VL of each of the columns.

Here, the Pch transistor 130 is an example of a second control transistor for supplying a second potential higher than the first potential to the vertical signal line VL. The voltage PBIAS_H is an example of the second potential. Moreover, the Pch transistor 129 is an example of a third control transistor for supplying the second potential to the pixel power supply line VDDCELL by controlling conduction and non-conduction between the vertical signal line VL and the pixel power supply line VDDCELL.

Moreover, when (i) the Nch transistor 131 and the Pch transistor 132 are connected in parallel to each other between the vertical signal line VL and a line OUTPUT that transmits a signal to the column readout circuit 106 and when (ii) control lines SO and NSO are transmitted to each of the gate electrodes and a "High" level and a "Low" level are provided to their respective gate electrodes at control pulses φSO and φNSO, respectively, the Nch transistor 131 and the Pch transistor 132 become an ON state and a signal is transmitted from the vertical signal line VL to the column readout circuit 106.

Here, the Nch transistor 131 and the Pch transistor 132 are an example of a fifth control transistor for controlling conduction and non-conduction between the vertical signal line VL and the column readout circuit 106.

A capacitor 133 has one electrode connected to the FD portion 124 and the other electrode connected to the vertical signal line VL. In other words, the FD portion 124 and the vertical signal line VL are capacitively coupled. A capacitor 134 has one electrode connected to the FD portion 124 and the other electrode connected to the pixel power supply line VDDCELL. In other words, the FD portion 124 and the pixel power supply line VDDCELL are capacitively coupled. The capacitor 133 and capacitor 134 may be a capacitance intentionally formed and incorporated, or may also be a parasitic capacitance.

A capacitor 135 has one electrode connected to the vertical signal line VL and the other electrode connected to the pixel power supply line VDDCELL. In other words, the vertical signal line VL and the pixel power supply line VDDCELL are capacitively coupled. This capacitor 135 mainly comprises a parasitic capacitance between the vertical signal line VL and the pixel power supply line VDDCELL. In order to actively form the parasitic capacitance, a first metal line that constitutes the vertical signal line VL arranged in the pixel array unit 102 and a second metal line that constitutes the pixel power supply line VDDCELL may be arranged parallel to each other.

It should be noted that the constant current source circuit 105 may be disposed at an upper end portion and a lower end portion of the pixel array unit. In this case, when the Pch transistor 129 that short-circuits the pixel power supply line VDDCELL on the vertical signal line VL is disposed at an upper end portion and a lower end portion of the pixel array unit, the vertical signal line VL and the pixel power supply line VDDCELL can be short-circuited at an upper end portion and a lower end portion of the pixel array unit. Therefore, an impedance between the vertical signal line VL and the pixel power supply line VDDCELL is decreased, making it easier for the power supply voltage AVDD to be transmitted to the vertical signal line VL in a short time.

Furthermore, when the Pch transistor 130 connected to the vertical signal line VL and the pixel power supply line VDDCELL is disposed at an upper end portion and a lower end portion of the pixel array unit, an impedance between the vertical signal line VL and the pixel power supply line VDDCELL is decreased, making it easier for a voltage PBIAS_H higher than the power supply voltage AVDD to be transmitted to the vertical signal lien VL in a short time.

Moreover, although in the present embodiment, the pixel cell 101 uses a configuration in which a single photodiode 120 and a single transfer transistor 121 are included, the configuration is not limited to this. It is possible to use a configuration in which at least two photodiodes and at least two transfer transistors are included.

Moreover, although the present embodiment describes a configuration in which the reset control line and the pixel power supply are connected to each other, it is possible to use a configuration in which the reset control line and the pixel power supply are separated.

Moreover it is possible to use a configuration of the pixel cell 101 in which a selection transistor is provided between the source side of the amplifying transistor and the vertical signal line VL.

Figure 3:
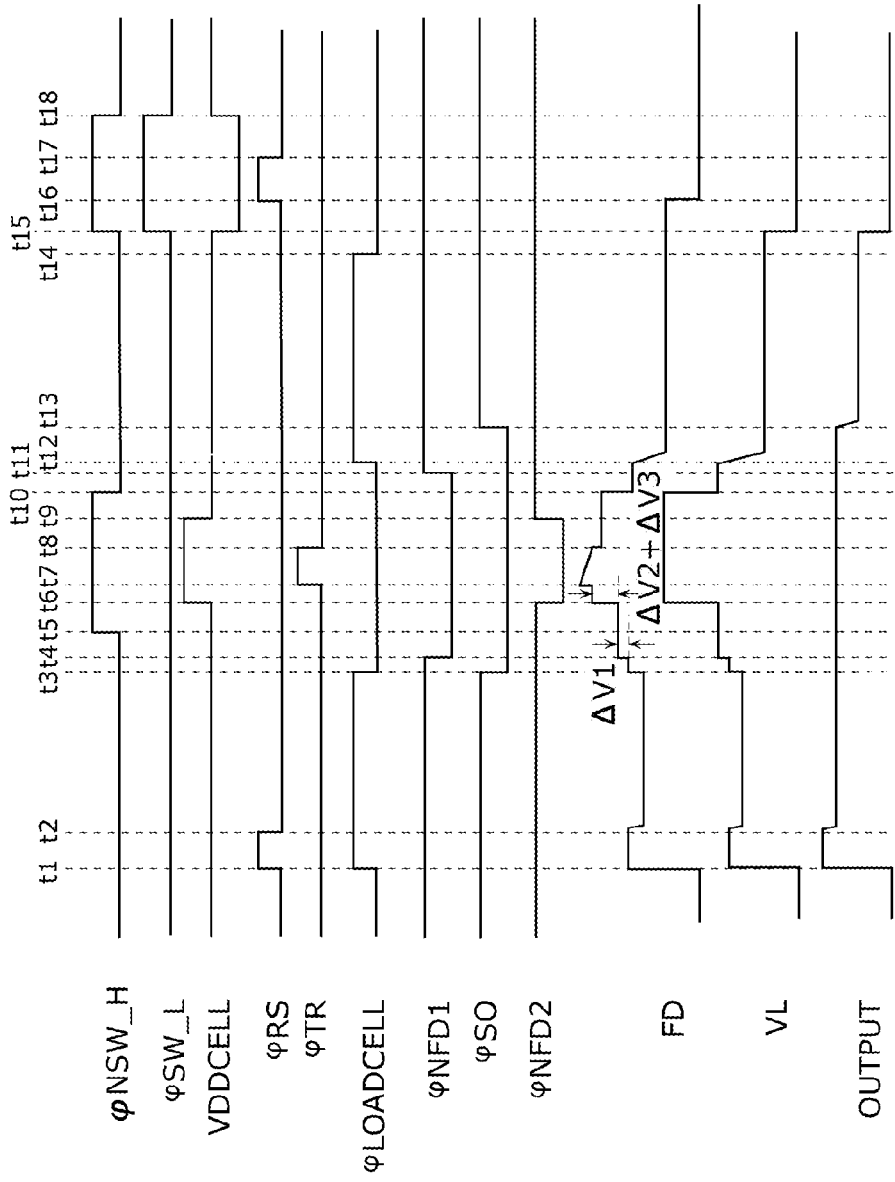
FIG. 3 is a timing chart for explaining the operation of the pixel illustrated in FIG. 2.

FIG. 3 is a timing chart for explaining the operation of the pixel illustrated in FIG. 2.

First, at time t1, φRS becomes a "High" level, the power supply voltage AVDD is applied to the FD portion, and a potential of the vertical signal line VL is increased. Moreover, φLOADCELL becomes a "High" level, a constant current flows through the amplifying transistor 123, and a source follower is formed. Although not illustrated in this figure, the voltage of the FD portion of other pixels connected to the same vertical signal line VL is held at a non-selection voltage PBIAS_L and the amplifying transistor is OFF.

At time t2, φRS becomes a "Low" level. At this time, there is a gap in the potential of the FD portion due to noise caused by switching the reset transistor 122 at a normal time.

At time t3, φSO becomes a "Low" level, a connection between the vertical signal line VL and a line OUTPUT that transmits a signal to the column readout circuit 106 is cut off, a potential fluctuation of the vertical signal line VL ceases to be transmitted to the column readout circuit 106. Moreover, φLOADCELL becomes a "Low" level, and a current ceases to flow through the amplifying transistor 123. With this, the potential of the vertical signal line VL is increased until the amplifying transistor 123 is turned OFF. Specifically, a potential (Vfd−Vth) obtained by decreasing, by a threshold Vth at that time, from a potential Vfd that is applied to the gate electrode of the amplifying transistor 123 is held in the vertical signal line VL.

At time t4, φNFD1 becomes a "Low" level. With this, when the vertical signal line VL is connected to the power supply voltage line VDDCELL, the power supply voltage AVDD is supplied to the vertical signal line VL. With this, since the vertical signal line VL and the FD portion are capacitively coupled by the capacitor 133, the potential of the FD portion 124 is increased by ΔV1 due to the coupling.

At time 5, φNSW_H becomes a "High" level. With this, a connection between the power supply voltage AVDD and the pixel power supply line VDDCELL of the pixel is cut off. However, since φLOADCELL is at a "Low" level and a current is not set to flow, the potentials of the pixel power supply line VDDCELL and the vertical signal line VL are held at the power supply voltage AVDD.

At time t6, φNFD2 becomes a "Low" level, and a voltage PBIAS_H higher than the power supply voltage AVDD is transmitted to the vertical signal line VL. Moreover, since the Pch transistor 129 is in an ON state, the voltage PBIAS_H is also transmitted to the pixel power supply line VDDCELL.

At this time, the voltage of the vertical signal line VL and the voltage of the pixel power supply line VDDCELL increase from the power supply voltage AVDD to high voltage PBIAS_H. However, since the rising voltage from an upper end portion and a lower end portion of the pixel array unit 102 is supplied simultaneously, the capacitor 135 between the vertical signal line VL and the pixel power supply line VDDCELL shows the same potential fluctuation at both electrodes and therefore there is almost no response delay by the capacitor 135.

With this, it is possible to reduce time for increasing the voltage of each of the vertical signal line VL and the pixel power supply line VDDCELL from the power supply voltage AVDD to high voltage PBIAS_H, and the charge amount on the capacitor 135 is further decreased. Therefore, a load of the high voltage generation circuit 110 is decreased and a driving force can be suppressed.

With this, since the vertical signal line VL and the FD portion are capacitively coupled by the capacitor 133, the potential of the FD portion 124 is increased by ΔV2 due to the coupling. Furthermore, since the pixel power supply line VDDCELL and the FD portion are capacitively coupled by the capacitor 134, the potential of the FD portion 124 is increased by ΔV3 due to the coupling. With this, even when the power supply voltage AVDD is decreased due to low power consumption, high voltage PBIAS_H generated in the high voltage generation circuit 110 is constant. Therefore, the potential of the FD portion during the transfer of charges of the photodiode 120 can be maintained by high voltage PBIAS_H, and the saturation output of the photodiode 120 can be secured.

Moreover, since a constant current does not flow through the amplifying transistor, the high voltage generation circuit 110 needs to have only a driving force to charge on the vertical signal line VL and the pixel power supply line VDDCELL to change from the power supply voltage AVDD to the high voltage PBIAS_H. This means that a load on the high voltage generation circuit 110 is reduced.

At time t7, φTR becomes a "High" level, the transfer transistor 121 is turned ON, signal charges are transferred from the photodiode 120 to the FD portion 124. At this time, since the potential of the FD portion 124 is increased by ΔV1+ΔV2+ΔV3 due to coupling, the signal charges of the photodiode are easy to be transferred to the FD portion.

At time t8, φTR changes from a "High" level to a "Low" level, and the transfer transistor 121 is turned OFF.

At time t9, φNFD2 become a "High" level, the Pch transistor 130 is OFF, and the potential of high voltage PBIAS_H ceases to be supplied to the vertical signal line VL.

At time t10, φNSW_H becomes a "Low" level, the Pch transistor 125 is turned ON, and the power supply voltage AVDD is supplied to the pixel power supply line VDDCELL. It should be noted that the existence of the Pch transistor 125 prevents high voltage PBIAS_H that is generated from the high voltage generation circuit 110 and the power supply voltage AVDD from being short-circuited. With this, a current flows in a direction from the high voltage generation circuit 110 to the power supply voltage AVDD, and suppresses a drop in the potential of the power supply voltage PBIAS_H.

At time t11, φNFD1 becomes a High level, the Pch transistor 129 is turned OFF, and the connection between the pixel power supply line VDDCELL and the vertical signal line VL is cut off.

At time t12, φLOADCELL becomes a "High" level, and a constant current is caused to flow through the amplifying transistor 123. With this, a source follower is formed by the amplifying transistor 123 and the constant current source transistor 128, and the potential level of the vertical signal line VL is changed to a potential level corresponding to that of the gate electrode the amplifying transistor 123.

At time t13, φSO becomes a "High" level, and the potential of the vertical signal line VL is transmitted to OUTPUT that is connected to the column readout circuit 106. It should be noted that when high voltage PBIAS_H that exceeds the power supply voltage AVDD of the vertical signal line VL during the transfer of signal charges is propagated to the column readout circuit 106, noise caused by the potential fluctuation is generated. Therefore, the potential fluctuation of the vertical signal line VL during the transfer of charges is not propagated to the column readout circuit 106 by controlling φSO, and noise generation is suppressed.

At time t14, φLOADCELL becomes a "Low" level, and a current ceases to flow through the amplifying transistor 123.

At time t15, φNSW_H becomes a "High" level, the supply of the power supply voltage AVDD to the pixel power supply line VDDCELL is cut off, φSW_L becomes a "High" level, and the potential of the pixel power supply line VDDCELL becomes a non-selection voltage PBIAS_L. At this time, the potential of the vertical signal line VL is also decreased via the amplifying transistor 123.

At time t16, φRS becomes a "High" level, the reset transistor 122 is turned ON, the pixel non-selection voltage PBIAS_L of the pixel power supply line VDDCELL is applied to the FD portion.

At time t17, φRS becomes a "Low" level, and the reset transistor 122 is turned OFF. With this, the non-selection voltage PBIAS_L is applied to the FD portion, and the amplifying transistor 123 is turned OFF.

At time t18, when φNSW_H becomes a "Low" level and φSW_H becomes a "Low" level, the power supply voltage AVDD is applied to the pixel power supply line VDDCELL.

As described above, according to Embodiment 1, when the Pch transistors 129 and 130 are turned ON during the transfer of signal charges from the photodiode 120 to the FD portion 124, the potentials of the vertical signal line VL and the pixel power supply line VDDCELL are applied to the voltage PBIAS_H higher than the power supply voltage. This makes it possible to increase the potential of the FD portion 124 which is capacitively coupled with each of the vertical signal line VL and the pixel power supply line VDDCELL.

Moreover, when the potential of the vertical signal line VL is increased to the power supply voltage AVDD (at time t4) and then is increased to PBIAS_H (at time t6), an amount of charge consumption on the high voltage generation circuit 110 can be decreased and the load can be decreased. Therefore, the driving force of the high voltage generation circuit 110 is reduced and a circuit area can be reduced.

Moreover, PBIAS_H that is a high voltage generated at the high voltage generation circuit 110 can be used as a voltage of a "High" level of the control pulse φTR of the gate electrode of the transfer transistor 121. Here, whether or not the transfer of signal charges from the photodiode 120 is easy depends on a magnitude relationship between the potential of the channel unit of the transfer transistor and the potential of the FD portion. Therefore, when high voltage PBIAS_H is used for increasing the potential of the gate electrode of the transfer transistor and the potential of the FD portion, the potential of the channel unit of the transfer transistor and the potential of the FD portion vary in the same direction even if the voltage of PBIAS_H varies. Therefore, it is easy to hold a magnitude relationship and to expand a voltage level range of PBIAS_H that can transfer signal charges.

With this, since it is possible to obtain a larger saturation output. Even when the power supply voltage AVDD is decreased, the control of the potential of the FD portion is possible by controlling BIAS_H. Therefore, both low power consumption and large saturation output can be realized.

It should be noted that the solid-state imaging apparatus and the method for driving the solid-state imaging apparatus described in Embodiment 1 are effective independently of the structure of the pixel. For example, a backside illumination type or a laminated sensor can be used.

Embodiment 2

The following describes a solid-state imaging apparatus according to Embodiment 2 with reference to the drawings. It should be noted that the present embodiment is the case of where the solid-state imaging apparatus according to the aforementioned Embodiment 1 (including the modifications) is applied to an imaging apparatus such as a camera that is included in a video camera capable of capturing moving pictures and a digital still camera capable of capturing still images.

Figure 4:
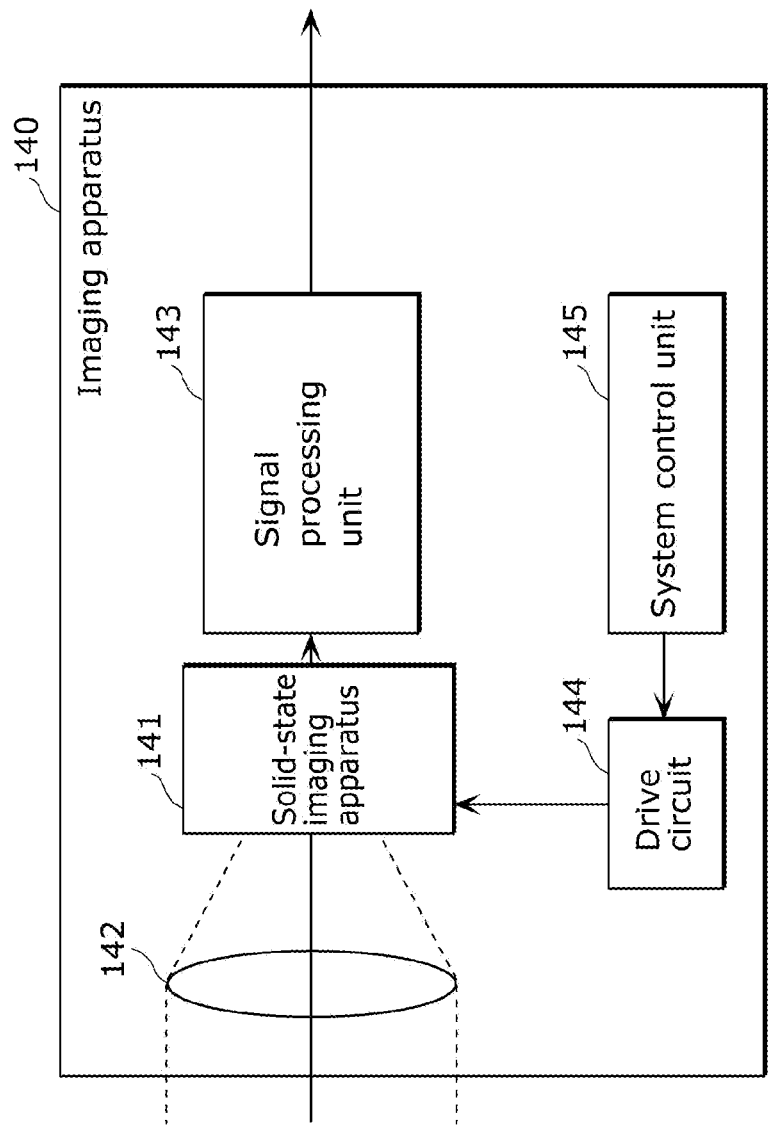
FIG. 4 is a diagram illustrating an example of a configuration in the case where a solid-state imaging apparatus according to Embodiment 2 is applied to a camera system.
Figure 5:
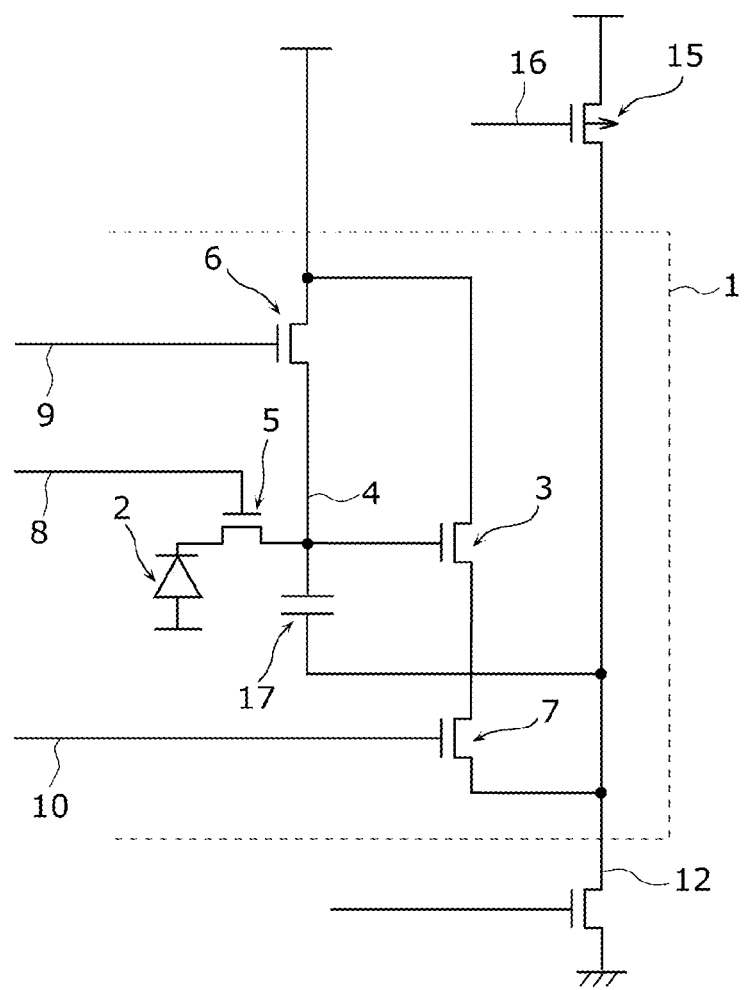
FIG. 5 is a diagram illustrating a configuration of a pixel that constitutes a conventional solid-state imaging apparatus.
Figure 6:
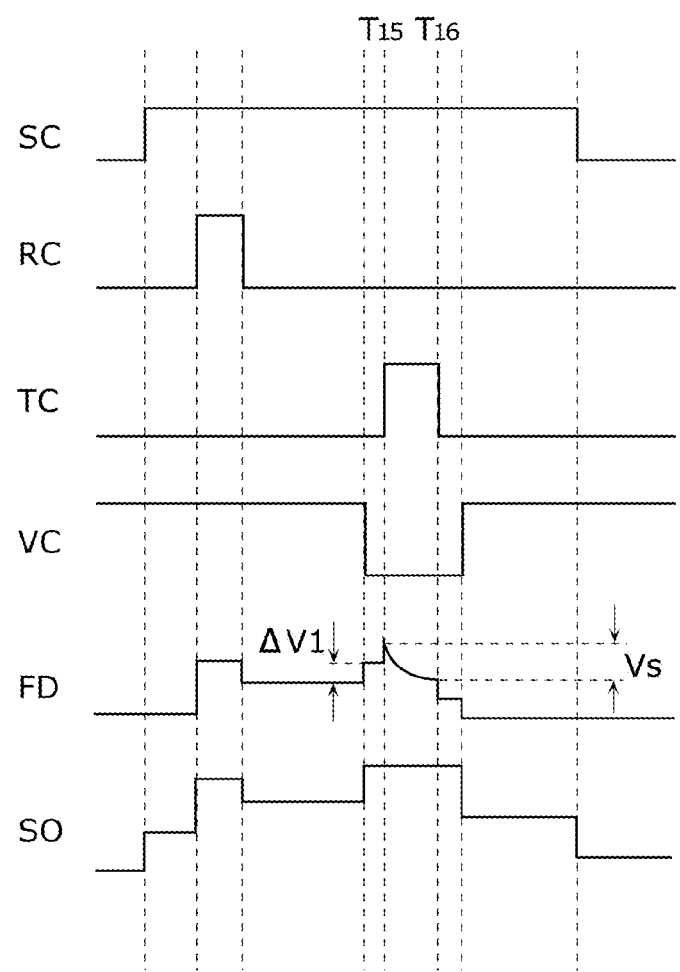
FIG. 6 is a timing chart for explaining the operation of the pixel illustrated in FIG. 5.

FIG. 4 is a block diagram illustrating a configuration of an imaging apparatus according to the present embodiment.

As illustrated in FIG. 4, an imaging apparatus 140 includes a solid-state imaging apparatus 141, an imaging optical system 142 that guides incident light from a subject to the solid-state imaging apparatus 141, a signal processing unit 143 that processes an output signal from the solid-state imaging apparatus 141, a drive circuit 144 that drives the solid-state imaging apparatus 141, and a system control unit 145 that controls the drive circuit 144.

Here, in the imaging apparatus 140 illustrated in FIG. 4, the solid-state imaging apparatus according to the aforementioned Embodiment 1 (including the modifications) is used as the solid-state imaging apparatus 141.

Moreover, the drive circuit 144 receives a control signal corresponding to a drive mode from the system control unit 145, and supplies a drive mode signal to the solid-state imaging apparatus 141. In the solid-state imaging apparatus 141 to which a drive mode signal is supplied, the timing generation circuit (TG 108 in FIG. 1) generates a drive pulse corresponding to the drive mode signal and supplies the drive pulse to each block in the solid-state imaging apparatus 141.

Moreover, the signal processing unit 143 receives an image signal outputted from the solid-state imaging apparatus 141, and performs various signal processes on the image signal.

As described above, since the solid-state imaging apparatus according to the aforementioned Embodiment 1 (including the modifications) is used in the imaging apparatus according to the present embodiment used in a video camera or a digital still camera, it is possible to suppress power consumption and to further increase a quality of the captured image by a high dynamic range.

As described above, although the solid-state imaging apparatus and the imaging apparatus according to aspects of the present disclosure have been described, the present disclosure is not limited to these embodiments. Those skilled in the art will readily appreciate that various modifications may be made in these exemplary embodiments without materially departing from the principles and spirit of the inventive concept, the scope of which is defined in the appended Claims and their equivalents.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure relates to a solid-state imaging apparatus, a method for driving the solid-state imaging apparatus, and an imaging apparatus which uses the solid-state imaging apparatus as an imaging device, and is applicable to a video camera, a digital camera, or the like.

The invention claimed is:
1. A solid-state imaging apparatus comprising:
a pixel array unit in which a plurality of pixel cells are arranged in a matrix, each of the plurality of the pixel cells including a photoelectric conversion element, a transfer transistor that transfers signal charges photoelectrically converted by the photoelectric conversion element to a floating diffusion, a reset transistor that resets the floating diffusion, and an amplifying transistor that outputs an amplified signal corresponding to an amount of the signal charges;

a vertical signal line that is connected to a source electrode of the amplifying transistor and receives an output of the amplifying transistor;

a pixel power supply line that is connected to a drain electrode of the amplifying transistor;

a first control transistor for supplying a first potential to the vertical signal line;

a second control transistor for supplying a second potential higher than the first potential to the vertical signal line; and a third control transistor for supplying the second potential to the pixel power supply line, wherein, during a period in which the transfer transistor is turned ON and transfers the signal charges to the floating diffusion, the second control transistor and the third control transistor are turned ON and the second potential is applied to the vertical signal line and the pixel power supply line.

2. The solid-state imaging apparatus according to claim 1, further comprising:

a constant current source transistor that is provided on the vertical signal line and forms a source follower with the amplifying transistor; and a fourth control transistor that controls conduction and non-conduction between the vertical signal line and the constant current source transistor, wherein, during a period in which at least the second control transistor and the third control transistor are ON, the fourth control transistor is OFF.

3. The solid-state imaging apparatus according to claim 1, wherein the third control transistor controls conduction and non-conduction between the vertical signal line and the pixel power supply line, and the second potential is supplied to the pixel power supply line via the second control transistor and the third control transistor.

4. The solid-state imaging apparatus according to claim 1, wherein a first metal line constituting the vertical signal line and a second metal line constituting the pixel power supply line are arranged parallel to each other, each of the first metal line and the second metal line being disposed in the pixel array unit.

5. The solid-state imaging apparatus according to claim 1, further comprising:

a column readout circuit that is provided on each of a plurality of the vertical signal lines corresponding to a different one of a plurality of columns of the pixel array unit and converts an amount of the signal charges read out to the each of the plurality of the vertical signal lines from analog format to digital format; and a fifth control transistor that controls conduction and non-conduction between the vertical signal line and the column readout circuit, wherein, during a period in which at least the second control transistor and the third control transistor are ON, the fifth control transistor is OFF.

6. The solid-state imaging apparatus according to claim 1, wherein the second potential is used as a controlled potential for turning ON the transfer transistor.

7. The solid-state imaging apparatus according to claim 1, wherein a set of the constant current source transistor for supplying a constant current to the vertical signal line, the first control transistor for supplying the first potential to the vertical signal line, the second control transistor for supplying the second potential to the vertical signal line, and the third control transistor for supplying the second potential to the pixel power supply line is disposed at each of an upper end portion and a lower end portion of the pixel array unit.

8. A method for driving a solid-state imaging apparatus, the solid-state imaging apparatus including:

a pixel array unit in which a plurality of pixel cells are arranged in a matrix, each of the plurality of the pixel cells including a photoelectric conversion element, a transfer transistor that transfers signal charges photoelectrically converted by the photoelectric conversion element to a floating diffusion, a reset transistor that resets the floating diffusion, and an amplifying transistor that outputs an amplified signal corresponding to an amount of the signal charges;

a vertical signal line that is connected to a source electrode of the amplifying transistor and receives an output of the amplifying transistor;

a pixel power supply line that is connected to a drain electrode of the amplifying transistor;

a first control transistor for supplying a first potential to the vertical signal line;

a second control transistor for supplying a second potential higher than the first potential to the vertical signal line; and a third control transistor for supplying the second potential to the pixel power supply line, the method comprising turning ON the second control transistor and the third control transistor and applying the second potential to the vertical signal line and the pixel power supply line, during a period in which the transfer transistor is turned ON and transfers the signal charges to the floating diffusion.

9. An imaging apparatus comprising:

the solid-state imaging apparatus according to claim 1 that captures an image of a subject;

an imaging optical system that guides incident light from the subject to the solid-state imaging apparatus; and a signal processing unit configured to process an output signal from the solid-state imaging apparatus.

* * * * *